United States Patent
Salvestro

(10) Patent No.: US 7,032,512 B2
(45) Date of Patent: Apr. 25, 2006

(54) EDGE TREATMENT OF FLEXOGRAPHIC PRINTING ELEMENTS

(75) Inventor: Aldo Salvestro, Burnaby (CA)

(73) Assignee: Kodak Graphic Communications Canada Company, Burnaby (CA)

( * ) Notice: Subject to any disclaimer, the term of this patent is extended or adjusted under 35 U.S.C. 154(b) by 183 days.

(21) Appl. No.: 10/671,682

(22) Filed: Sep. 29, 2003

(65) Prior Publication Data

US 2004/0067443 A1 Apr. 8, 2004

Related U.S. Application Data

(60) Provisional application No. 60/416,249, filed on Oct. 7, 2002.

(51) Int. Cl.
*B41N 3/00* (2006.01)

(52) U.S. Cl. ............... 101/401.1; 101/395; 101/401.3; 101/484; 101/490; 430/306; 430/307

(58) Field of Classification Search ............ 101/401.1, 101/401.3, 395, 490, 484; 430/306, 307
See application file for complete search history.

(56) References Cited

U.S. PATENT DOCUMENTS

| 3,904,492 | A | * | 9/1975 | Rich et al. ................ 205/126 |
| 6,161,479 | A | * | 12/2000 | Murray .................... 101/453 |
| 6,180,325 | B1 | | 1/2001 | Gelbart .................... 430/397 |
| 6,312,871 | B1 | * | 11/2001 | Cusdin et al. ............ 430/273.1 |
| 6,318,262 | B1 | * | 11/2001 | Wolber et al. ........... 101/401.1 |
| 6,326,124 | B1 | | 12/2001 | Alince et al. ............ 430/273.1 |

* cited by examiner

*Primary Examiner*—Andrew H. Hirshfeld
*Assistant Examiner*—Jill E. Culler

(57) ABSTRACT

A method is provided for reducing UV exposure to edges of a printing plate which occurs when the printing plate is subjected to UV illumination. The method involves a spray head comprising one or more spray nozzles for spraying edge masking material toward the printing plate and a controller connected to control relative movement between the spray head and the printing plate. The method comprises receiving, at the controller, information related to the locations of the edges of the printing plate. In response to the information received at the controller, the controller provides controlled relative movement between the spray head and the printing plate causes the spray nozzles to spray edge masking material onto the edges of the printing plate. The method may be performed by a variety of apparatus.

62 Claims, 9 Drawing Sheets

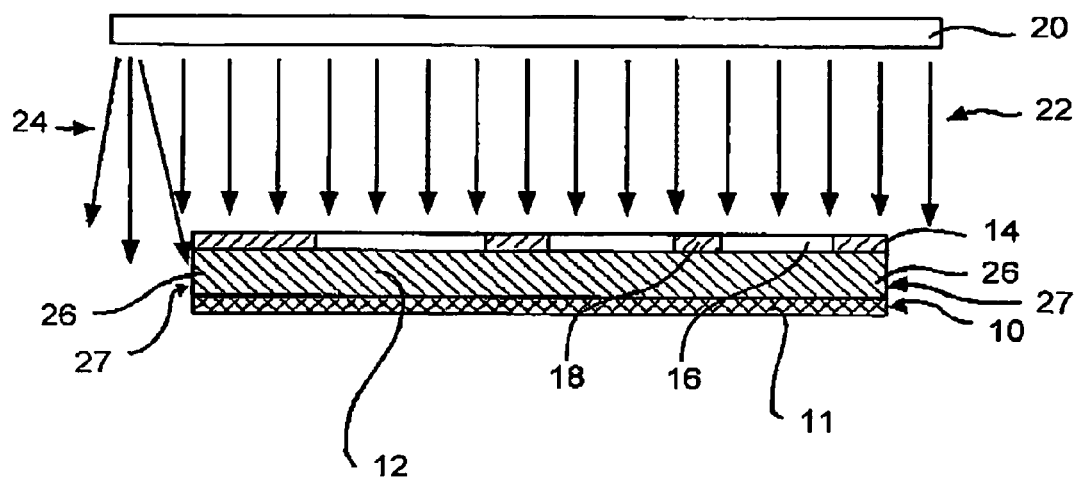
FIG. 1-A
PRIOR ART
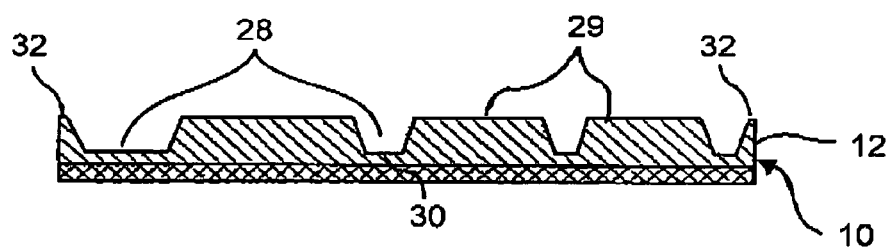
FIG. 1-B
PRIOR ART

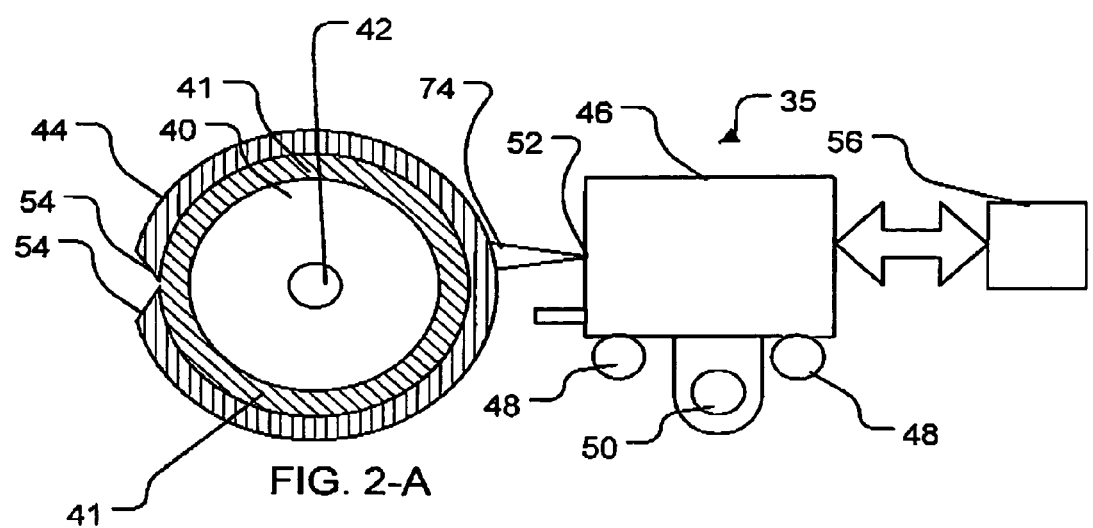
FIG. 2-A
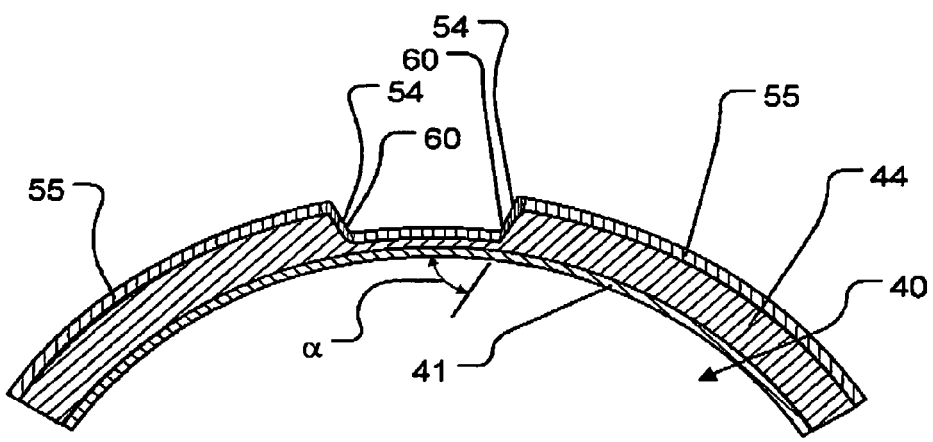
FIG. 2-B

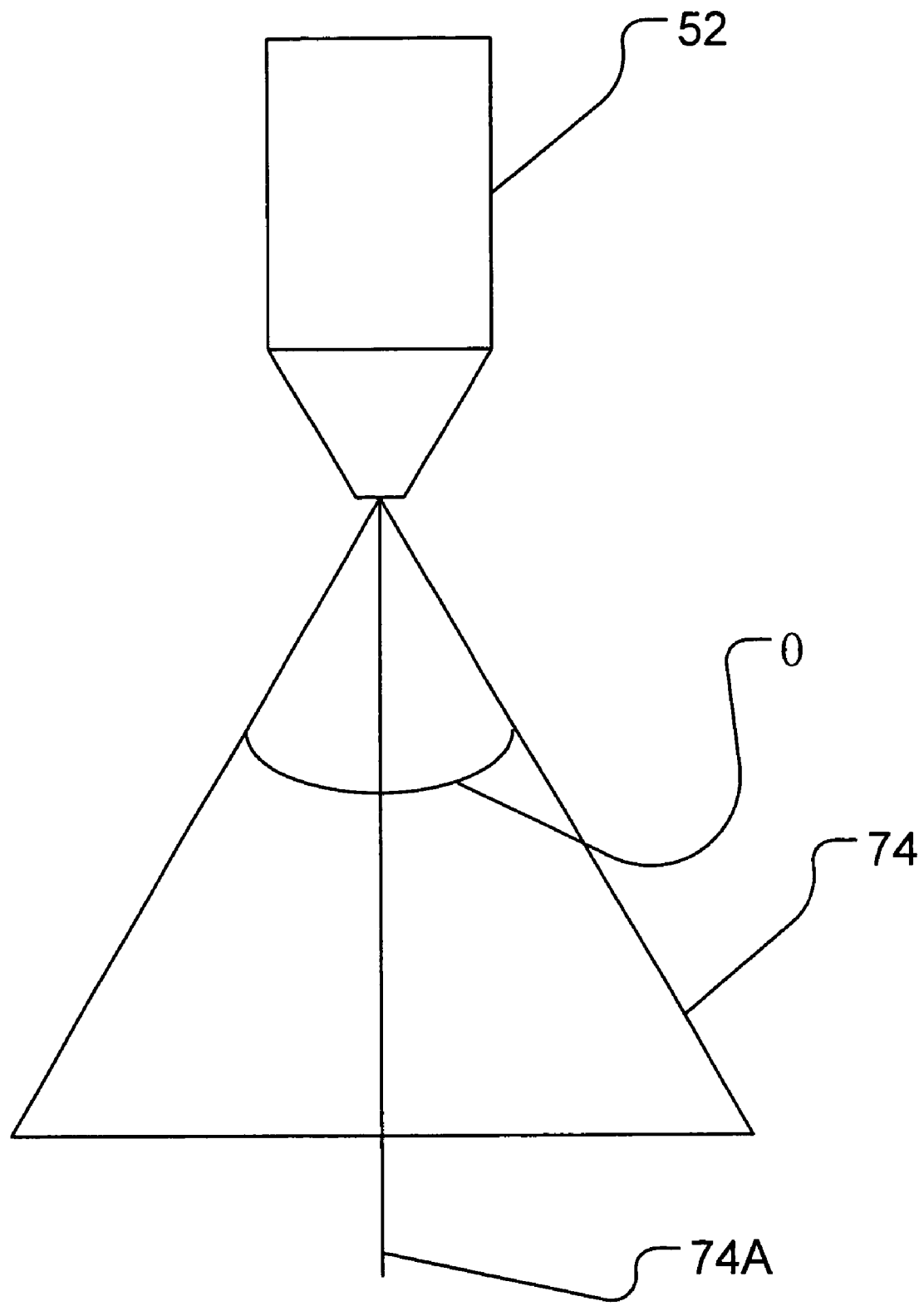
FIGURE 2-C

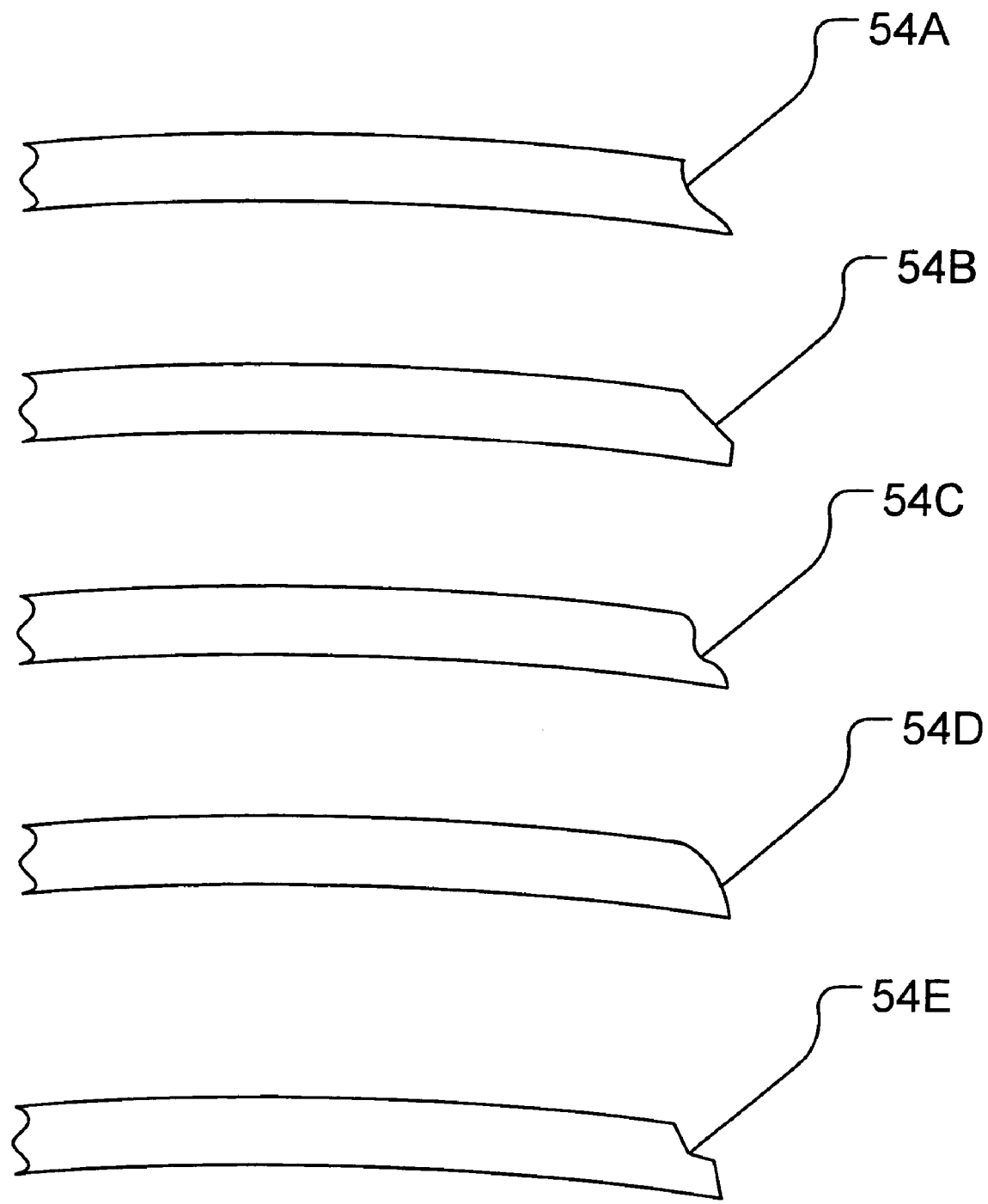
FIGURE 2-D

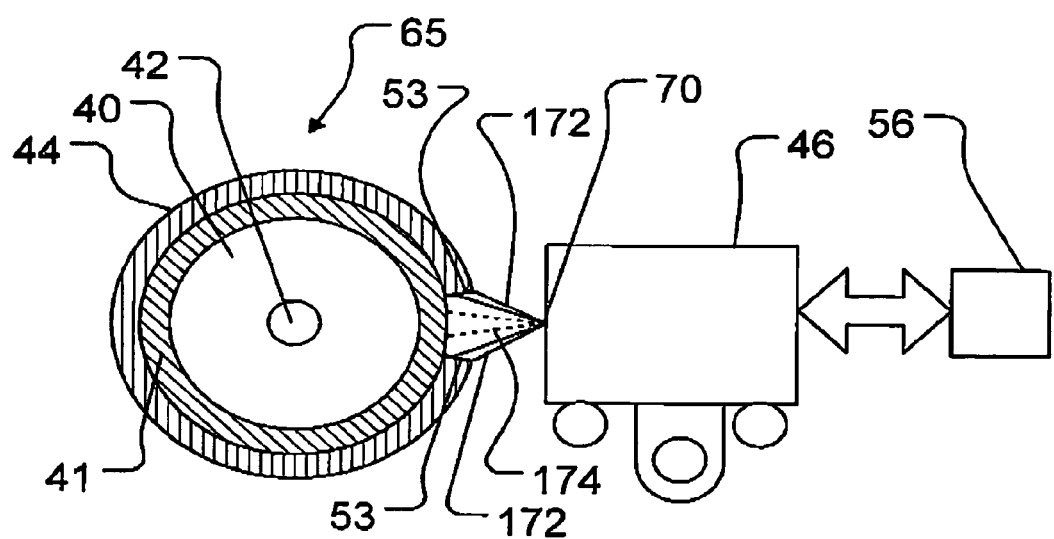
FIGURE 5-A
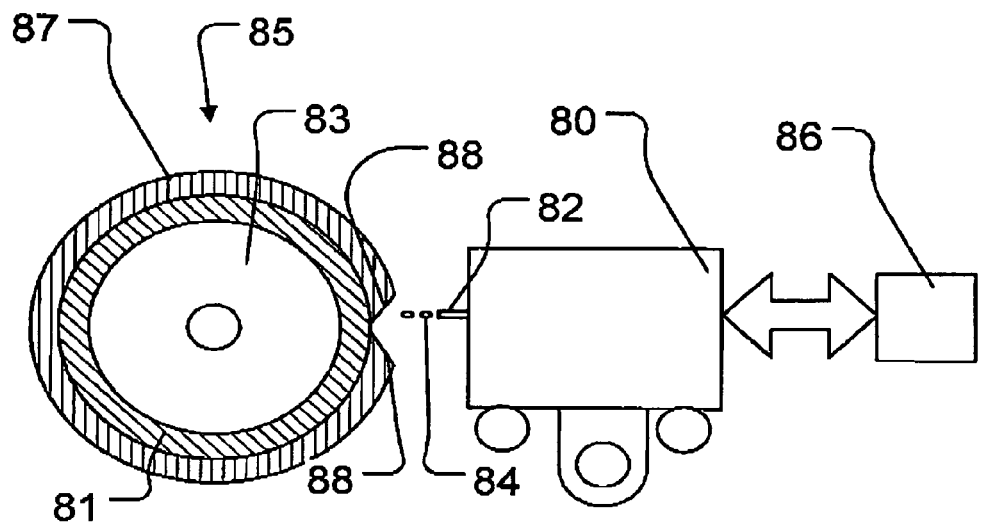
FIGURE 6

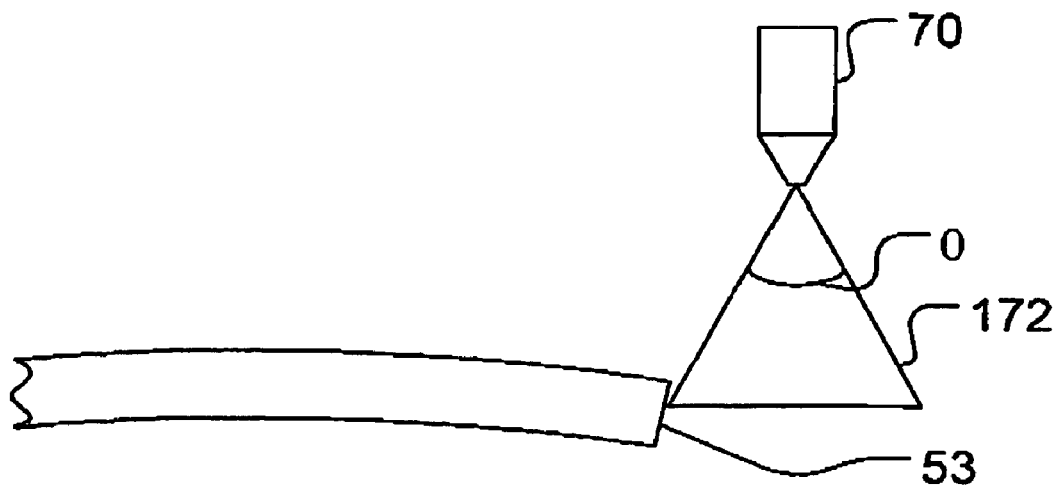
FIGURE 5-B
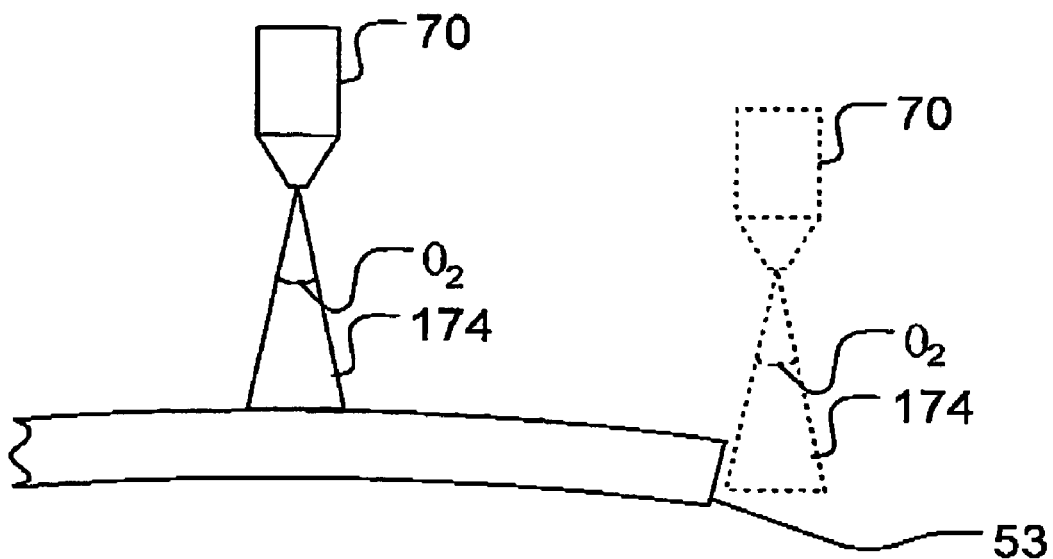
FIGURE 5-C

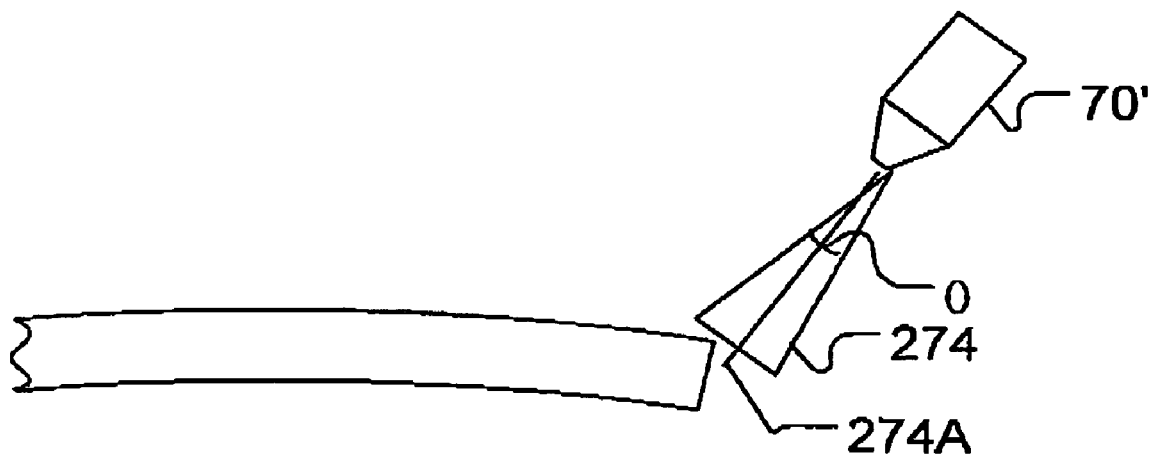
FIGURE 5-D

EDGE TREATMENT OF FLEXOGRAPHIC PRINTING ELEMENTS

REFERENCE TO RELATED APPLICATION

This application claims the benefit of U.S. Patent Application Ser. No. 60/416,249 filed Oct. 7, 2002.

TECHNICAL FIELD

This invention relates to flexographic printing. Particular embodiments of the invention relate to apparatus and methods for preparing and imaging flexographic printing plates and treating the edges thereof.

BACKGROUND

Printing plates used in flexographic printing typically comprise a photopolymer layer or some other photosensitive imageable layer. Traditionally, an image is applied to the printing plate by exposing the photopolymer layer to actinic radiation (e.g. ultraviolet (UV) flood radiation) with a UV-opaque image mask interposed between the radiation source and the printing plate. Because of the image mask, some regions of the photopolymer are exposed to the radiation while other regions of the photopolymer are not exposed. The exposure to actinic radiation changes the properties of the photopolymer in the exposed region, for example by cross-linking. After imaging, the plates are processed to remove either the exposed photopolymer regions or the unexposed photopolymer regions, thereby creating a relief-based image on the printing plate. The processed plates are then mounted on a printing press, where they are used to transfer ink to desired printing surface(s).

Recently, it has become possible to prepare flexographic printing plates with an integral UV-opaque surface mask layer. Such UV-opaque surface mask layers are typically sprayed or roll-coated over the photopolymer surface after the plate has been fabricated and then imagewise patterned to form a mask. Imagewise patterning may involve ablating or removing masking material from the plate or otherwise converting masking material between UV-transparent and UV-opaque states.

One type of integral UV-opaque surface mask layer is known as laser ablation mask system ("LAMS") layer. In operation, the UV-opaque LAMS layer is coated onto the top surface of the printing plate's photopolymer layer and is then selectively (i.e. imagewise) patterned. Patterning the LAMS layer typically involves selective laser ablation of the LAMS layer. Such laser radiation may be provided by infrared (IR) lasers on a laser imaging head which is part of a digital imaging device, for example. Regions of the LAMS layer which have been ablated in this manner become UV-transparent, creating a mask that is integral with the photopolymer layer of the printing plate. After ablating the LAMS layer to create the mask, the plate is exposed to actinic flood radiation. In regions where the LAMS layer has been ablated to become UV-transparent, the underlying photopolymer layer is exposed to the actinic radiation. Conversely, in regions where the LAMS layer has not been ablated and is still UV-opaque, the underlying photopolymer layer is not exposed. The exposure to actinic radiation changes the properties of the photopolymer in the exposed regions. The plates are then processed to create a relief-based image on the printing plate by removing the LAMS layer and either the exposed or unexposed photopolymer regions. The processed plates may then be used in a printing press to transfer ink to desired printing surface(s).

Further advances in the art have made it possible to provide many plate preparation procedures "in the round" (i.e. on the cylindrical surface of a drum rather than on a flat two-dimensional surface). Such "in the round" procedures may involve, for example, applying a surface mask layer to the photopolymer layer of a printing plate, imagewise ablating or otherwise imagewise patterning the surface mask layer, exposing the masked plate to actinic flood radiation and subsequent processing.

In order to perform these types of plate preparation procedures "in the round", it is desirable for the printing plates to be easily supported on the cylindrical surface of a drum. One technique, known as continuous photopolymer sleeve ("CPPS"), involves providing a seamless cylindrical tube of photopolymer (a "CPPS plate"). The tubular CPPS plate may be mounted on the drum of a plate preparation device and/or a printing press by sliding the tubular CPPS plate axially over the cylindrical surface of the drum. The inner diameter of the tubular CPPS plate is typically sized for a snug fit on the cylindrical surface of the drum.

CPPS plates suffer from a number of limitations. It is difficult to fabricate seamless CPPS plates, making them relatively expensive in comparison to conventional flat printing plates. CPPS plates are inefficient to transport, because the tubular-shaped CPPS plates occupy a large volume for the amount of printable surface area which they provide. Handling of CPPS plates is difficult, particularly after the sensitive LAMS layer (or other surface mask layer) has been applied. The use of CPPS plates may also be inefficient where an image to be printed occupies only a small region of the CPPS plate.

In an alternative technique known as "plate-on-sleeve", one or more sections of initially flat printing plate are cut to size and then applied to (i.e. wrapped around) the cylindrical surface of a tubular sleeve. Such tubular sleeves may be made from a variety of materials known in the art. Typically, the one or more sections of printing plate are mounted on the cylindrical surface of the tubular sleeve using a specialized plate-on-sleeve plate mounting apparatus. The one or more plate section(s) may be fastened to the tubular sleeve by any of a wide variety of techniques known in the art. The tubular sleeve bearing the one or more sections of printing plate may be mounted on the cylindrical drum of a plate preparation device and/or a printing press by sliding the tubular sleeve axially over the cylindrical surface of the drum. The inner diameter of the tubular sleeve may be sized for snug fit on the cylindrical surface of the drum.

Plate-on-sleeve preparation of printing plates has a number of advantages over CPPS techniques. Plate-on-sleeve printing plates may be fabricated and transported as flat sheets which may be subsequently cut or otherwise divided into appropriately sized plate section(s) and applied to the tubular sleeve, reducing fabrication and transportation costs. Once the plate section(s) are mounted on the tubular sleeve, non-plate bearing regions of the sleeve may be used for handling. In addition, the printing plate section(s) may be sized to fit the images being printed, maximizing the efficiency of plate usage.

One difficulty common to all techniques for preparing flexographic printing plates having LAMS layers or other types of integral surface masks occurs at the edges of the plate. FIG. 1-A shows a printing plate 10 having a base layer 11, a photopolymer layer 12 and an integral surface mask layer 14. Surface mask layer 14 may be a LAMS layer, for example. In the illustration of FIG. 1-A, surface mask layer 14 has already been imagewise patterned (for example, by selective ablation) to create a mask having UV-transparent regions 16 and UV-opaque regions 18. UV radiation source 20 produces a flood illumination field, schematically depicted by arrows 22. Actinic radiation field 22 exposes the areas of photopolymer layer 12 under UV-transparent mask regions 16, while the areas of photopolymer layer 12 located under UV-opaque mask regions 18 are not exposed. The exposure to actinic radiation changes the properties of photopolymer layer 12 in the exposed regions.

FIG. 1-A shows that surface mask layer 14 (which has been sprayed or roll coated onto the top of photopolymer layer 12) does not cover the peripheral edges 27 of plate 10. While arrows 22, which schematically depict the flood actinic radiation field, are shown as perpendicular to the surface of printing plate 10, those skilled in the art will appreciate that the flood radiation also spreads laterally from UV source 20, as shown by arrows 24. As a result of this spreading, actinic radiation 24 incident on unmasked edges 27 of plate 10 at least partially exposes edge regions 26 of photopolymer layer 12. The exposure of edge regions 26 at least partially changes the properties of the photopolymer therein.

After UV exposure, printing plate 10 is processed, to produce the plate 10 shown in FIG. 1-B. Processing typically involves the use of solvents and/or other procedures to remove LAMS layer 14. In the illustrated embodiment, processing also involves removing the unexposed regions of photopolymer layer 12 to form recessed regions 28. As shown in FIG. 1-B, recessed regions 28 are formed where photopolymer layer 12 was masked by the UV-opaque mask regions 18 of LAMS layer 14. In practice, there may be a base level 30 of photopolymer layer 12 which is formed, for example, by prior UV exposure (not shown) originating from the underside of plate 10. Processing does not remove photopolymer from regions 29, where photopolymer layer 12 has been exposed. As a result, regions 29 provide relief with respect to base level 30 in regions 28. When subsequently used in a printing press (not shown), ink is applied to the upper surface of plate 10. Because of their relative relief, ink applied to regions 29 is transferred to the material being printed, whereas ink applied to recessed regions 28 is not transferred.

The exposure of edge regions 26 to actinic radiation 24 results in the formation of ridges 32 (FIG. 1-B). Ridges 32 cause problems because they are not part of the desired image and when ultimately used in a printing press, ink applied to ridges 32 may be undesirably transferred to the material being printed.

In conventional (i.e. flat) preparation of flexographic plates, ridges 32 may be trimmed before the plate is mounted on the cylindrical drum of a printing press. However, ridges 32 present a particular difficulty when printing plates are prepared "in the round", because it is difficult to trim ridges 32 from CPPS plates or from plate section(s) which have already been affixed to a sleeve in a plate-on-sleeve process.

U.S. Pat. No. 6,326,124 (Alince et al.) describes a UV-opaque edge covering material which may be manually brushed or sprayed onto the edges of a printing plate prior to UV exposure to reduce the occurrence of ridges. Other known techniques involve the manual application of UV-opaque tapes or strips to the edges of plates prior to exposure.

There is a general need to reduce or eliminate ridges and/or similar effects which occur at the edges of flexographic printing plates during plate preparation. There is a particular need for automated apparatus and methods for accomplishing this objective.

SUMMARY OF THE INVENTION

One aspect of the invention provides a method for preparing a flexographic printing plate having a photosensitive imageable layer. The method involves mounting the printing plate on a cylindrical drum. While the printing plate is on the drum, the method comprises: applying a surface mask layer to the printing plate, such that the surface mask layer masks the surface of the photosensitive imageable layer; applying an edge masking layer to at least one edge of the printing plate, such that the edge masking layer masks at least a portion of at least one edge of the photosensitive imageable layer; and patterning the surface mask layer. Applying an edge masking layer is performed in response to data. Such data may include: image data; format data; data relating to one or more dimensions of the printing plate; data relating to one or more edge locations of the printing plate; data relating to one or more dimensions of the photosensitive imageable layer; and data relating to one or more edge locations of the photosensitive imageable layer.

Both the surface mask layer and the edge masking layer may be formed from a material having the same composition. Applying the surface mask layer to the printing plate and applying the edge masking layer to the at least one edge of the printing plate may be performed in a single operation.

After application of the edge masking layer, the method may involve irradiating the edge masking layer to form an edge mask area. Patterning the surface mask layer may involve imagewise irradiating the surface mask layer.

The printing plate may comprise a continuous photopolymer sleeve or one or more plate sections applied to a tubular sleeve.

The method may also involve exposing at least a portion of the photosensitive imageable layer to actinic radiation, which may be preformed while the printing plate is on the drum or after the printing plate has been removed from the drum. After exposing at least a portion of the photosensitive imageable layer to actinic radiation, the method may involve removing portions of the photosensitive imageable layer to form a relief image.

The edge(s) of the photosensitive imageable layer may have a bevelled profile with a bevel angle of less than 90°. The method may comprise cutting the bevelled profile on an automated cutting table in accordance with format data supplied to a controller associated with the automated cutting table.

The edge masking material and/or the surface masking material may comprise a negative working material, which may contain carbon. Alternatively, the edge masking material and/or the surface mask material may comprise a positive working material which may require radiation to make the mask opaque to actinic radiation. In the further alternative, the surface mask layer may comprise a positive working material and the edge masking layer may comprise a negative working material.

The method may involve determining, based on format data associated with the printing plate, at least one of: the data relating to one or more edge locations of the photosensitive imageable layer; the data relating to one or more dimensions of the photosensitive imageable layer; the data relating to one or more edge locations of the printing plate; and the data relating to one or more dimensions of the printing plate. Additionally or alternatively, the method may involve determining the same types of data using an edge detection sensor. The edge detection sensor may comprise at least one of: an optical sensor; an imaging sensor; a capacitive probe; and a physical contact-based edge detector.

Another aspect of the invention provides a method for preparing a flexographic printing plate. The method involves mounting one or more plate sections comprising photopolymer layers to a tubular sleeve and mounting the tubular sleeve with the mounted plate sections onto a cylindrical drum. While the sleeve is on the drum and in response to data provided by a controller, an edge masking layer is applied to the one or more plate sections for masking one or more edges of the photopolymer layers associated with the one or more plate sections.

The one or more plate sections may comprise an integral surface mask layer. Alternatively, the method may involve applying a surface mask layer to printing areas of the one or more plate sections. The surface mask layer may be applied to the printing areas of the one or more plate sections while they are on drum.

Another aspect of the invention provides a method for preparing a flexographic printing plate. The method involves mounting a printing plate comprising a photopolymer layer on a cylindrical drum. While the printing plate is on the drum and in response to data provided by a controller, the method comprises imagewise applying a patterned surface mask layer to a printing area of the printing plate and applying an edge masking layer to the printing plate for masking one or more edges of the photopolymer layer.

Applying the edge masking layer to the printing plate may comprise ejecting liquid from one or more inkjet nozzles.

Another aspect of the invention provides a method for preparing a flexographic printing plate. The method involves mounting a printing plate comprising an integral surface mask layer and a photopolymer layer on a cylindrical drum. While the printing plate is on the drum and in response to data provided by a controller, an edge masking layer is applied to the printing plate for masking at least one edge of the photopolymer layer and the integral surface mask layer is patterned.

Another aspect of the invention provides a method for preparing a flexographic printing plate, the method involves mounting the printing plate on a cylindrical drum, providing a spray head comprising one or more spray nozzles for spraying edge masking material toward the drum and providing a controller connected to control relative movement between the spray head and the drum. Information is received at the controller from which locations of one or more edges of the printing plate are determinable. While the printing plate is on the drum and in response to the information received at the controller, the method comprises providing controlled relative movement between the spray head and the drum and spraying edge masking material from the one or more spray nozzles onto the one or more edges of the printing plate.

The method may involve bevelling the edges of the printing plate prior to mounting the printing plate on the drum.

Another aspect of the invention provides an apparatus for applying an edge masking material to edges of a printing plate. The apparatus comprises a drum for supporting a printing plate on a cylindrical surface thereof, a spray head having one or more spray nozzles oriented to spray an edge masking material toward the drum and one or more actuators for providing relative movement between the spray head and the drum. A controller is connected to receive information from which locations of one or more edges of the printing plate are determinable. In response to the information, the controller is configured to provide suitable control signals to the one or more actuators for controlled relative movement between the spray head and the drum and to provide suitable control signals to the one or more spray nozzles to cause the one or more spray nozzles to spray edge masking material onto the one or more edges of the printing plate.

The one or more edges of the printing plate may comprise a bevelled profile.

The moveable spray head may comprise one or more spray nozzles for spraying a surface mask material toward the drum. The controller may be configured, in response to the information received at the controller, to provide controlled relative movement between the spray head and the drum by providing a suitable control signal to the one or more actuators and to spray a surface mask material from the one or more spray nozzles onto an imageable surface of the printing plate.

The surface mask material may be the same as the edge masking material and the one or more spray nozzles for spraying the surface mask material may be the same as the one or more spray nozzles for spraying the edge masking material.

The apparatus may also comprise a mounting table for supporting the printing plate and a pressure roller. The pressure roller and the drum may be rotatable about their respective elongated axes and movable to positions adjacent an edge of the mounting table where a leading edge of the printing plate may be made to project between the pressure roller and the drum, such that rotation of the pressure roller and the drum draws the printing plate from the mounting table and onto the cylindrical surface of the drum.

The apparatus may comprise a tubular sleeve supported on the cylindrical surface of the drum and interposed between the cylindrical surface and the printing plate.

The apparatus may comprise a tubular sleeve mounted on the cylindrical surface of the drum and means for mounting the printing plate on the tubular sleeve.

Further aspects and features of specific embodiments of the invention are described below.

BRIEF DESCRIPTION OF THE DRAWINGS

In drawings, which illustrate non-limiting embodiments of the invention:

FIG. 1-A is a schematic illustration depicting a printing plate being imaged according to a typical prior art plate preparation process;

FIG. 1-B is a schematic illustration of the printing plate of FIG. 1-A after processing;

FIG. 2-A is a schematic sectional view of a mask application apparatus according to a particular embodiment of the invention;

FIG. 2-B is an enlarged partial view of the printing plate of FIG. 2-A;

FIG. 2-C is a schematic cross-sectional depiction of a spray nozzle and its spray pattern;

FIG. 2-D is a schematic partial cross-sectional view of a number of example bevelled edge profiles suitable for use in accordance with the invention;

FIG. 5-A is a schematic sectional view of a mask application apparatus according to an alternative embodiment of the invention;

FIG. 5-B is a schematic cross-sectional view of a spray nozzle of the FIG. 5-A apparatus configured for spraying a first spray pattern;

FIG. 5-C is a schematic cross-sectional view of a spray nozzle of the FIG. 5-A apparatus configured for spraying a second spray pattern;

FIG. 5-D is a schematic cross-sectional view of a spray nozzles having a non-orthogonal orientation; and, FIG. 6 is a schematic sectional view of a mask application apparatus according to a further alternative embodiment of the invention.

DESCRIPTION

Figure 3:
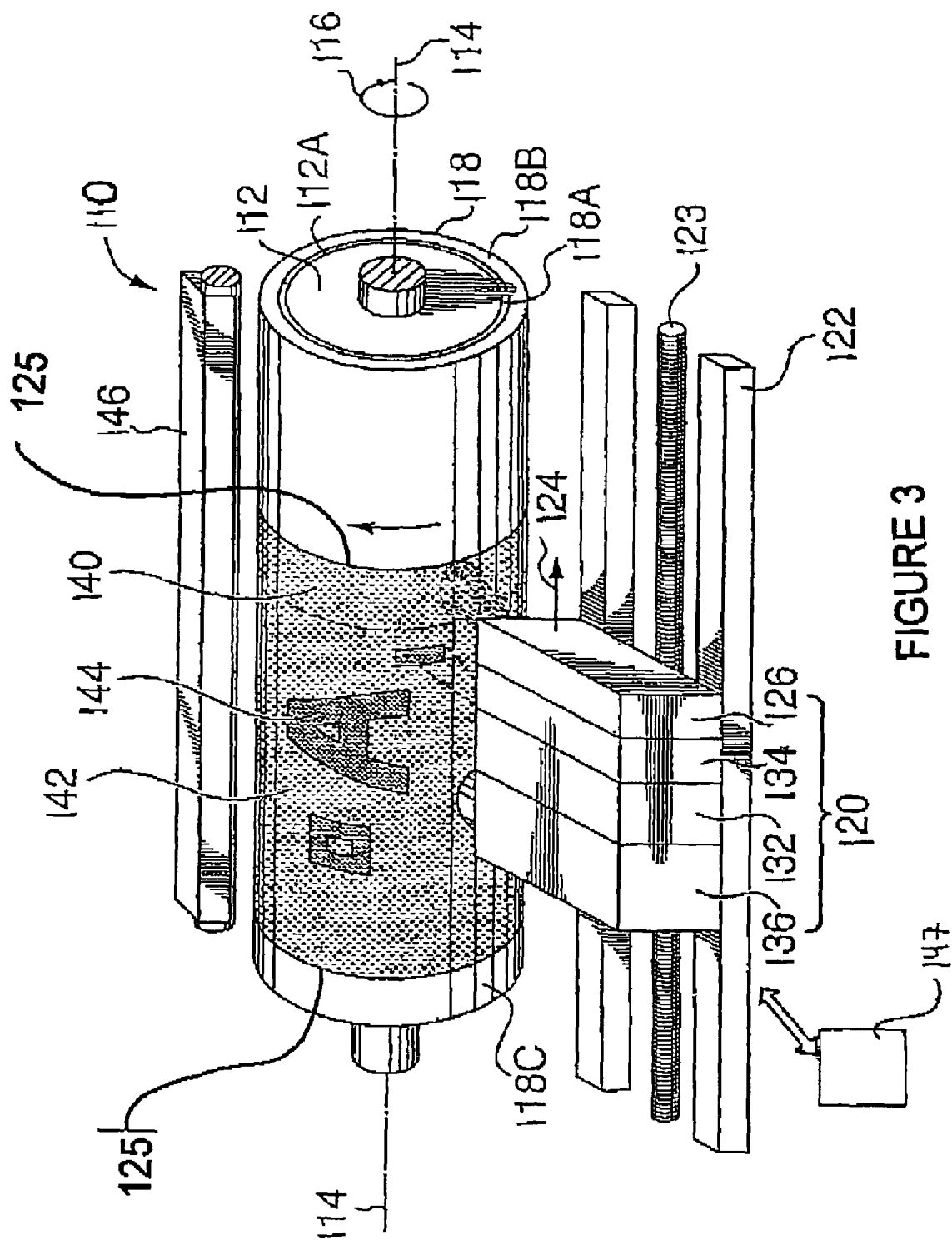
FIG. 3 is a schematic isometric view of a combined mask application/plate patterning apparatus according to a particular embodiment of the invention.

Throughout the following description, specific details are set forth in order to provide a more thorough understanding of the invention. However, the invention may be practised without these particulars. In other instances, well known elements have not been shown or described in detail to avoid unnecessarily obscuring the invention. Accordingly, the specification and drawings are to be regarded in an illustrative, rather than a restrictive, sense.

This invention involves automated apparatus and methods for preparing flexographic printing plates by applying masking material to the edges of photosensitive layers (e.g. photopolymer layers) of printing plates. To simplify the language of this description and the accompanying claims, plate(s), printing plate(s) and printing plate section(s) should be interpreted to include, without limitation, unprepared and partially prepared printing plate precursor(s) and printing plate element(s) regardless of their type and regardless of their state of preparation, as well as more fully prepared printing plate(s). Such plate(s) typically include a photosensitive imageable layer which may be a photopolymer layer or the like. The plate(s) may be CPPS plates and/or plate section(s) mounted on a sleeve in a plate-on-sleeve process.

In accordance with the invention, the masking material is applied to the edges of the plates by one or more spray nozzle(s) located on a spray head. Preferably, relative movement between the spray head and the printing plate is provided and the nozzle(s) are activated/deactivated in response to data supplied by a controller. More specifically, the controller is provided with information regarding the location of the edges of the printing plates. In response to that information, the controller may cause the spray head to travel along the edges while the nozzle(s) spray masking material onto the edges. Additionally or alternatively, the controller may control the movement of the spray head to apply a surface mask (for example, by line traversal or helical traversal) and may use the location of the edges to control the spray nozzle(s), activating the spray nozzle(s) to apply masking material on the surface and edges of the plates, and deactivating the spray nozzle(s) when the spray head moves over a region not occupied by a plate or a plate edge. The controller may use other techniques to apply masking material to the edges of a printing plate in response to edge location information.

The edges of the printing plate(s) may be provided with a bevelled profile which facilitates application of sprayed masking material. Additionally or alternatively, the nozzle(s) located on the spray head may be configured for expulsion of a widely diverging spray pattern or the spray nozzle(s) may be oriented to aim their spray pattern(s) at a non-orthogonal angle relative to the printing plate. Such spray pattern(s) may be used for application of masking material to perpendicular (i.e. non-bevelled) edges of printing plates. Selective coating heads comprising inkjet nozzle(s) may also be used for imagewise application of masking material to the surfaces and/or edges of printing plates. Advantageously, this invention may involve integrating edge coating spray heads into other flexographic plate preparation apparatus, such as a mask application device, a combined mask application/plate patterning device, or, in the case of a plate-on-sleeve process, a combined mask application/plate mounting device.

FIG. 2-A shows a schematic sectional view of a printing plate mask application apparatus 35 according to a particular embodiment of the invention. Mask application apparatus 35 comprises a cylindrical drum 40 which is rotatable about its elongated axis 42. Drum 40 supports a photopolymer-based printing plate 44 on its cylindrical surface. In the illustrated embodiment, printing plate 44 has been affixed to a tubular sleeve 41 in a plate-on-sleeve process. Plate 44 may have been previously mounted onto sleeve 41 using a plate-on-sleeve plate mounting apparatus (not shown). Although not shown in FIG. 2-A, those skilled in the art will appreciate that more than one section of printing plate 44 may be mounted on sleeve 41, as is typical in a plate-on-sleeve process. Drum 40 of mask application device 35 may also accommodate seamless CPPS plates.

In the illustrated embodiment, edges 54 of plate 44 are bevelled with a straight angular profile having a bevel angle $\alpha$ (see FIG. 2-B). Preferably, bevel angle $\alpha$ is less than 90° from a plane tangential to the imageable surface of plate 44. Bevel angle $\alpha$ may be in the range between 20°–80°. The bevel of edges 54 is preferably provided prior to mounting plate 44 onto sleeve 41. Edges 54 may be fabricated to have a bevelled profile. Edges 54 may also be cut to provide a bevelled profile using an automated cutting table (not shown) as described in commonly assigned Canadian Patent Application No. 2,359,259 (Salvestro), which is hereby incorporated by reference. The cutting of edges 54 may be performed in response to format data supplied to a cutting table controller. Such format data may indicate the particular bevel angle $\alpha$ of any angled cut to be performed.

As shown in FIG. 2-A, mask application device 35 comprises a spray head 46 which is moveable in a direction parallel with axis 42 upon a pair of tracks 48. In the illustrated embodiment, a lead screw (not shown) extends through threaded aperture 50, such that rotation of the lead screw causes axial movement of spray head 46 upon tracks 48. Other linear actuation devices may be used to provide axial movement of spray head 46.

As spray head 46 moves axially and drum 40 rotates about its axis, one or more suitably oriented spray nozzle(s) 52 apply an integral surface mask layer 55 (FIG. 2-B) to the outer surface of plate 44. A schematic cross-sectional representation of a spray nozzle 52 and its spray pattern 74 is shown in FIG. 2-C. Spay pattern 74 has a central axis 74A and a divergence angle $\theta$. Preferably, but not necessarily, divergence angle $\theta$ is within a range of 20°–120°. Spray nozzle 52 is preferably oriented such that central axis 74A is substantially orthogonal to the imageable surface of printing plate 44 (i.e. the cylindrical surface of drum 41). In alternative embodiments discussed further below, spray nozzle 52 may be oriented such that central axis 74A is non-orthogonal to the imageable surface of plate 44.

As spray head 46 moves axially and drum 40 rotates about its axis, spray nozzle(s) 52 apply a surface mask layer 55 (FIG. 2-B) to the outer surface of plate 44. Surface mask layer 55 may be applied by spray head 46 and nozzle(s) 52 as described in commonly assigned U.S. Pat. No. 6,180,325 (Gelbart), which is hereby incorporated by reference. For example, surface mask layer 55 may be applied in a helical pattern wherein drum 40 rotates at the same time as spray head 46 moves axially. As an alternative example, surface mask layer 55 may be applied in a line traversal pattern wherein spray head 46 moves axially over the surface of printing plate 44 to spray a first line (i.e. a line traversal) and then drum 40 rotates by a small amount whereupon spray head 46 makes another axial line traversal. Surface mask layer 55 may be a LAMS layer. Surface mask layer 55 may alternatively comprise other types of masking materials which may be patterned by other patterning techniques.

As shown in FIG. 2-B, spray nozzle(s) 52 of spray head 46 also spray an edge masking layer 60 over bevelled edges 54 of plate 44. The bevelled profile of edges 54 ensures that edge masking layer 60 applied by spray nozzle 52 adequately coats edges 54.

Edge masking layer 60 and surface mask layer 55 preferably comprise a material having the same composition, so that surface mask layer 55 and edge masking layer 60 may be applied by the same nozzle(s) 52 in a single operation. For example, if surface mask layer 55 is applied according to a line traversal process, then surface mask layer 55 and edge masking layer 60 may be applied to plate 44 in a single line traversal of spray head 46. Spray head 46 may also make several traversals of plate 44 (both axial and circumferential) to apply surface mask layer 55 and/or edge masking layer 60. Spray head 46 may also dwell over edges 54 to ensure that a sufficient amount of edge masking material is sprayed to form edge masking layer 60.

When implemented as a LAMS layer, surface mask layer 55 and edge masking layer 60 are UV-opaque, IR-absorbing material(s). For example, edge masking layer 60 may comprise a mixture of carbon black and a suitable binder in an organic or aqueous solvent. Carbon black is advantageous, because it is opaque to UV radiation and absorbs IR patterning radiation. In some cases, it may be advantageous to apply one or more intermediate layer(s) (not shown) in between the photopolymer layer of plate 44 and surface mask layer 55 and/or edge masking layer 60. Such intermediate layer(s) may prevent surface mask layer 55 and/or edge masking layer 60 from interacting with the photopolymer layer on plate 44.

The relative movement of spray head 46 and drum 40 and the activation/deactivation and/or spray rate of nozzle(s) 52 is preferably controlled by controller 56 which may comprise one or more suitably programmed embedded processor(s), external processor(s), computer(s) or the like. In order to effect such control, controller 56 may be provided with information regarding the location, size and shape of plate 44, the image(s) to be applied to plate 44, format data regarding plate 44 and the images to be recorded thereon and the like. Format data may include, without limitation, the size of the image, the size of the plate, relationships between the size of the image and the size of the plate, the location(s) of one or more images on the plate, the location(s) of one or more plates on the drum and the like.

Controller 56 is provided with information regarding the location of edges 54 of plate 44, which it uses to apply edge masking layer 60. For example, controller 56 may be programmed with software that determines or reads where an image is to be formed on a particular printing plate and determines a pattern for the desired application of surface mask layer 55 and/or edge masking layer 60. Such software may determine where the edges of a plate are relative to the image and then cause the application of edge masking layer 60 in a pattern which comprises the area between the edges 54 of plate 44 and the edge of the image (not shown).

In alternative embodiments, mask application apparatus 35 may be equipped with an edge detection system (not shown) which provides edge location information to controller 56. Edge detection systems may generally comprise any type of edge detectors, such as optical edge detectors, imaging edge detectors, capacitive probes and/or physical contact-based edge detectors, for example. In a plate-on-sleeve precess where multiple printing plate sections (not shown) are mounted on sleeve 41, controller 56 may also be provided with similar information in respect of each or any of the plate sections.

Controller 56 uses edge information to apply edge masking layer 60 by controlling the relative movement of spray head 46 and drum 40 and/or the activation of nozzle(s) 52. In one embodiment, controller 56 uses edge information to cause spray head 46 to controllably travel along edges 54 while nozzle(s) 52 spray masking material onto edges 52. The controlled movement of spray head 46 along edges 54 may be caused, for example, by linear actuation of spray head 46, rotation of drum 40 or some combination thereof. Controller 56 may also control the rate of travel of spray head 46 and/or the spray rate of nozzle(s) 52 to achieve desired properties (e.g. thickness) of edge masking layer 60.

In an alternative embodiment, controller 56 controllably moves spray head 46 to apply a surface mask (for example, by line traversal or helical traversal) and uses edge location information to control the activation of spray nozzle(s) 52. Controller 56 may activate spray nozzle(s) 52 to apply masking material on the surface and edges 54 of plate 44, and may deactivate spray nozzle(s) 52 when spray head 56 moves over a region not occupied by plate 44 or its edges 54. Once again, controller 56 may control the rate of travel of spray head 46 and/or the spray rate of nozzle(s) 52 to achieve desired properties of edge masking layer 60. For example, controller 56 may cause spray head 46 to dwell for a period of time over edges 54 to achieve a desired thickness of edge masking layer 60.

Mask application apparatus 35 may also comprise an optional drying unit (not shown) to dry surface mask layer 55 and/or edge masking layer 60 after application. The drying unit may comprise a fan, a nozzle connected to a source of compressed gas and/or a heater, for example.

After application of surface mask layer 55 and edge masking layer 60, plate 44 is patterned. Patterning may be performed in a separate patterning apparatus (not shown). When surface mask layer 55 is a LAMS layer, the patterning apparatus comprises an imaging head with one or more selectively actuatable patterning lasers. These selectively actuatable patterning lasers, which may be IR lasers, imagewise ablate certain regions of surface mask layer 55 to remove the material of surface mask layer 55 from these regions or to otherwise make these regions UV-transparent. Flood actinic illumination is then applied to plate 44, exposing the photopolymer which underlies the UV-transparent regions of surface mask 55. Since edges 54 of plate 44 are coated with edge masking layer 60, the actinic illumination does not expose the photopolymer underlying edges 54. Plate 44 is then processed to remove the surface mask layer 55, the edge masking layer 60 and either the exposed or non-exposed regions of the photopolymer layer. Since edges 54 of plate 44 were not exposed to actinic radiation, there are no ridges or similar edge effects on plate 44. Plate 44 may then be mounted on the drum of a printing press to transfer the image imparted thereon to desired printing surface(s).

In the illustrated embodiment of FIGS. 2-A and 2-B, bevelled edges 54 are axial edges which extend substantially parallel to the axis 42 of drum 40. Edges of plate 44 having other orientations, such as circumferential edges (i.e. edges extending around the circumferential surface of drum 40) and/or skewed edges (i.e. edges that are neither axial or circumferential). In the illustrated embodiment, bevelled edges 54 are shown having a straight bevelled profile with a bevel angle α with respect to the imageable surface of printing plate 44. Bevelled edges 54 may also have alternative profiles which expose edges 54 to spray from spray nozzle(s). Such bevelled edge profiles may be curved or may have a number of angular sections. A number of non-limiting examples of bevelled edge profiles 54A, 54B, 54C, 54D, 54E are depicted in FIG. 2-D. Preferably, alternative embodiments of bevelled edge 54 have a profile wherein a tangent to the surface of bevelled edge 54 forms a bevel angle α with the circumferential surface of drum 40 and the bevel angle α is less than 90°. Preferably, the bevel angle α is within the range of 20°–80° over at least a majority of bevelled edge 54. In some embodiments, bevelled edge 54 may only exist in the region of the photopolymer layer and other portions of the printing plate may have a conventional orthogonal edge profile.

Edge masking layer 60 and/or the surface mask layer 55 may comprise negative working material or positive working material. A mask layer comprising negative working material is conventionally UV-opaque after application to the printing plate. An imaging beam may then pattern the mask, rendering portions of the mask transparent to UV radiation or removing portions of the mask to expose the underlying photopolymer. After patterning the mask, the photopolymer layer of the printing plate may be exposed to actinic radiation to form a relief image on the plate. A mask layer comprising positive working material is conventionally UV-transparent after application to the printing plate. An imaging beam may then pattern the mask, rendering portions of the mask opaque to UV radiation. These opaque portions of the mask will block subsequently applied actinic radiation, but portions of the mask not exposed to patterning radiation remain transparent to actinic radiation and will allow the exposure of the underlying photopolymer to form a relief image on the plate.

In cases where edge masking layer 60 comprise positive working material, edge masking layer 60 is exposed to radiation to form a UV-opaque edge mask area. In addition, where surface mask layer 55 comprises a positive working material, surface mask layer 55 may be patterned by exposing portions of surface mask layer 55 to radiation. Patterning radiation sources which are normally used to pattern surface mask layer 55 (not shown in FIGS. 2-A, 2-B) may have to be refocused or otherwise adjusted to provide sufficient exposure to the edges 54 of plate 44. Alternatively, different radiation sources may be used to expose edge masking layer 60 of plate 44 and to pattern surface mask layer 55.

FIGS. 5-A, 5-B and 5-C depict a mask application apparatus 65 according to an alternative embodiment of the invention, where edges 53 of photopolymer plate 44 are non-bevelled (i.e. substantially orthogonal to the imageable surface of plate 44). In mask application apparatus 65, spray head 46 comprises one or more variable spray nozzle(s) 70. Variable nozzle(s) 70 are configurable to provide different spray patterns 172, 174. As shown in FIG. 5-B, nozzle 70 may be adjusted to provide a widely diverging spray pattern 172 having a divergence angle $\theta_1$. The wide divergence angle $\theta_1$ of spray pattern 172 makes this configuration of variable nozzle(s) 70 suitable for spraying an edge masking material onto the non-bevelled edges 53 of plate 44. As shown in FIG. 5-C, nozzle 70 may be adjusted to provide a relatively narrowly diverging spray pattern 174 having a divergence angle $\theta_2$. The narrow divergence angle $\theta_2$ of spray pattern 174 makes this configuration suitable for spraying a surface mask onto plate 44 (FIG. 5-C) and for spraying an edge masking layer on a bevelled edge (not shown). However, as shown in dashed lines in FIG. 5-C, the narrow divergence angle $\theta_2$ of spray pattern 174 makes this configuration unsuitable for applying an edge masking material to non-bevelled edge 53. Mask application apparatus 65 of FIG. 5-A otherwise comprises components and functionality that is substantially similar to that of mask application apparatus 35 shown in FIG. 2-A and described above.

In further alternative embodiments, a spray head may comprise one or more nozzle(s) particularly configured for applying edge masking material to the plate edges. Such spray heads may be separate spray heads comprising only edge spraying nozzle(s) or such spray heads may comprise one or more principal nozzle(s) for spraying a surface mask layer on a printing plate and/or one or more auxiliary edge spraying nozzle(s). In one example, a spray head may comprise one or more edge spraying nozzle(s) which spray a widely diverging spray pattern (similar to widely diverging spray pattern 172 of FIG. 5-B) capable of coating a non-bevelled edge. In another example depicted schematically in FIG. 5-D, a spray head may comprise one or more edge spraying nozzle(s) 70' oriented such that the central axis 274A of their spray pattern(s) 274 is directed towards the printing plate at a non-orthogonal angle. Such angularly oriented edge spraying nozzle(s) may apply edge masking material to a non-bevelled edge. Preferably, such angularly oriented edge spraying nozzle(s) are oriented such that the central axis 274A of their spray patterns forms an angle in a range between 20°–80° with respect to the imageable surface of the printing plate. A spray head may comprise a plurality of edge spraying nozzles having a plurality of non-orthogonal orientations, such that they may apply edge masking material to plate edges having a number of different orientations. A spray head may also comprise one or more edge spraying nozzle(s) having adjustable orientations, such that the edge spraying nozzle(s) may be oriented at a plurality of desired angles with respect to the various plate edges for applying edge masking material to plate edges having a number of different orientations. These alternative embodiments may also be used to spray edge masking material onto bevelled printing plate edges.

FIG. 3 shows a combined mask application/plate patterning apparatus 110 in accordance with one embodiment of the invention. Apparatus 110 includes a drum 112 which is mounted for rotation about an axis 114 as indicated by arrow 116. A printing plate 118 is mounted on the cylindrical surface 112A of drum 112. Printing plate 118 comprises a base layer 118A and a photopolymer layer 118B. In the illustrated embodiment, printing plate 118 is a seamless CPPS plate, wherein base layer 118A fits snugly onto the cylindrical surface 112A of drum 112. Drum 112 may also accommodate one or more sections of printing plate mounted on a sleeve in a plate-on-sleeve process. Head 120 is mounted on tracks 122 for movement in a direction parallel to axis 114 as indicated by arrow 124. Axial movement of head 120 is actuated by rotation of lead screw 123. Other linear actuation devices may be used to provide axial movement of head 120.

Printing plate 118 is initially mounted onto the cylindrical surface 112A of drum 112 prior to application of a surface mask layer. Moveable head 120 includes a coating unit 126 which preferably comprises one or more spray nozzle(s) (not shown) for application of surface mask layer 140 onto photopolymer layer 118B. Surface mask layer 140 may be applied to photopolymer layer 118B in the manner described above and in commonly assigned patent U.S. Pat. No. 6,180,325 (Gelbart).

In addition to applying surface mask layer 140, the spray nozzle(s) of coating unit 126 apply an edge masking layer (not shown) to the edges 125 of printing plate 118. The spray nozzle(s) used for application of the edge masking layer may be the same spray nozzle(s) used for the application of surface mask layer 140 or they may be different spray nozzle(s). Preferably, as described above, edges 125 of plate 118 are provided with a bevelled profile, such that the edge masking layer applied by coating unit 126 adequately coats edges 125. Coating unit 126 and its spray nozzle(s) may comprise any of the embodiments described above and may function as described above for application of edge masking material to edges 125 of printing plate 118. A controller 147 may be provided with the same types of information and function in the same manner described above to control the relative movement of drum 112 and coating unit 126 and the activation and/or spray rate of the nozzles.

In the illustrated embodiment of FIG. 3, printing plate 118 is a seamless CPPS plate. Accordingly, the spray nozzle(s) of coating unit 126 apply the edge masking layer only to circumferential edges 125. Where drum 112 supports one or more sections of printing plate mounted on a sleeve in a plate-on-sleeve process (not shown), the spray nozzle(s) of coating unit 126 apply the edge masking layer to all of the edges of the printing plate sections.

In the illustrated embodiment, head 120 comprises an optional drying unit 134 to dry surface mask layer 140 and the edge masking layer after application. Drying unit 134 may comprise a fan, a nozzle connected to a source of compressed gas and/or a heater, for example.

Head 120 of combined mask application/plate patterning apparatus 110 also comprises a patterning unit 132 used to selectively pattern surface mask layer 140. Typically, patterning of surface mask layer 140 may involve creation of UV-transparent regions 144 within UV-opaque mask regions 142 or vice versa. In the case where surface mask layer 140 is a LAMS layer, patterning unit 132 comprises one or more IR lasers (not shown) which ablate surface mask layer 140 in regions 144. Ablation removes surface mask layer in regions 144 to make these regions UV-transparent. Patterning unit 132 receives control signals from controller 147. These control signals specify the locations of regions 142, 144 and switches each laser on when the control signal indicates that the laser's beam is directed at a point in a region 144. Where surface mask layer 140 is some other type of mask layer, patterning unit 132 may comprise some other selectively actuatable device for converting surface mask layer 140 from UV-opaque to UV-transparent (or vice versa) in regions 142, 144.

In the illustrated embodiment, head 120 also comprises a UV illumination unit 136. UV illumination unit 136 comprises at least one DV source (not shown) for exposing photopolymer layer 118B to actinic radiation through the mask formed by the patterned regions 142, 144 of surface mask layer 140. In the illustrated embodiment, combined mask application/plate patterning apparatus 110 also comprises an optional blanket cleaner 146 which may be used to remove surface mask layer 140 and the edge masking layer after UV exposure. In some embodiments, combined mask application/plate patterning apparatus 110 may not include UV illumination unit 136. In such embodiments, photopolymer layer 118B may be exposed to actinic radiation in a separate apparatus.

Combined mask application/plate patterning apparatus 110 minimizes the handling of plate 118 by providing a single apparatus for: (i) the application of surface mask layer 140 and the edge masking layer by coating unit 126; (ii) the selective (i.e. imagewise) patterning of surface mask layer 140 by patterning unit 132 to form UV-opaque and UV-transparent regions 142, 144; and (iii) the UV exposure of patterned regions 142, 144 by UV illumination unit 136. In particular, handling of plate 118 is minimized after application of surface mask layer 140 which may be particularly sensitive. Once plate 118 is exposed to actinic radiation from UV illumination unit 136, surface mask layer 140 is no longer required, so any subsequent damage to surface mask layer 140 is inconsequential.

Figure 4:
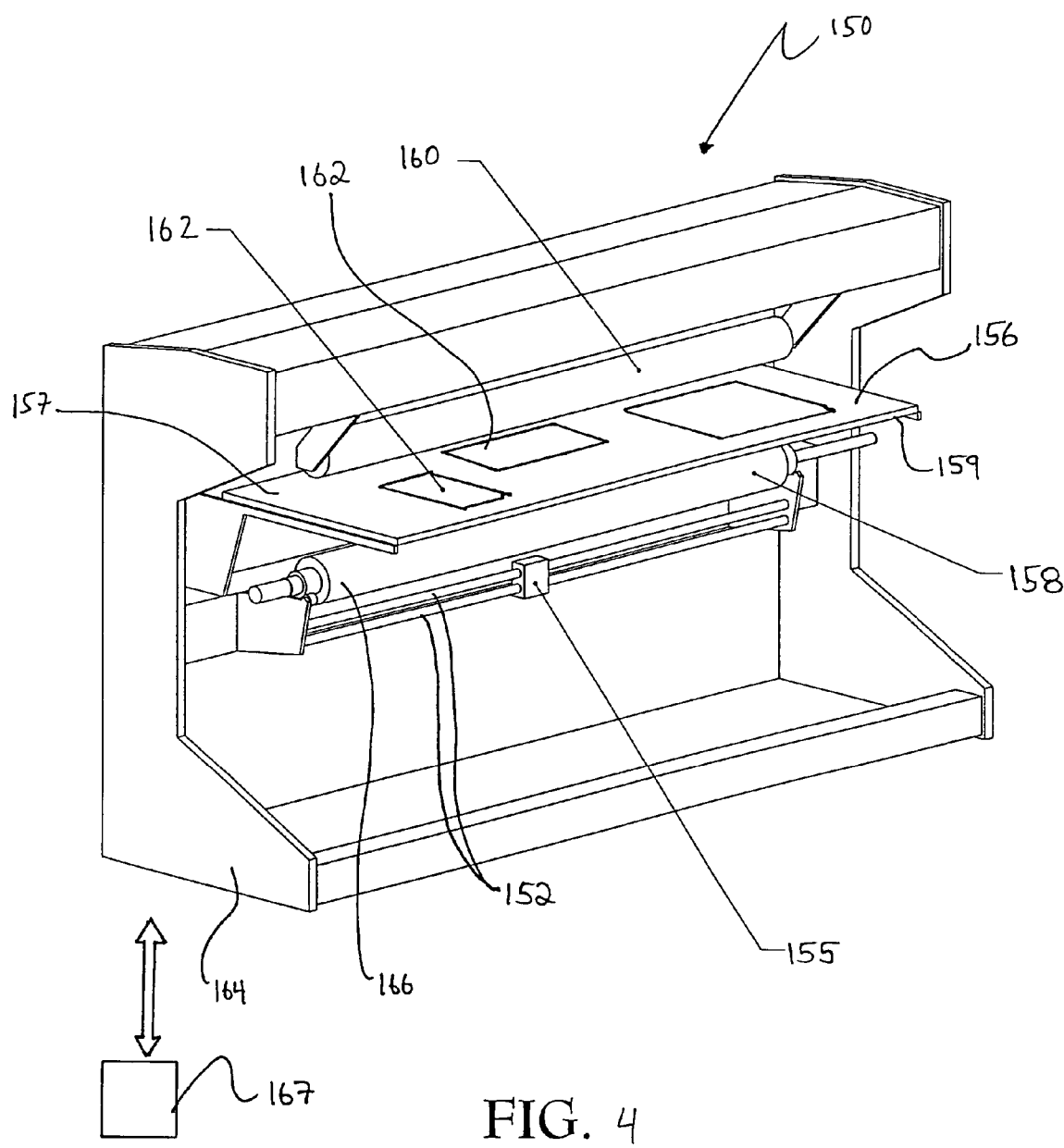
FIG. 4 is a schematic isometric view of a combined mask application/plate mounting apparatus according to a particular embodiment of the invention.

FIG. 4 shows a combined mask application/plate mounting apparatus 150 for use in a plate-on-sleeve process. Apparatus 150 includes a frame 164 which supports cylindrical drum 158, pressure roller 160 and table 156. Cylindrical drum 158, pressure roller 160 and table 156 are translatable within frame 164. Cylindrical drum 158 and pressure roller 160 are also rotatable within frame 164 about their respective elongated axes. Apparatus 150 also comprises a spray head 155 which is moveable along tracks 152 in a direction parallel with the elongated axes of cylindrical drum 158 and pressure roller 160. Movement of spray head 155 may be effected by a lead screw, for example, or by any other suitable linear actuator (not shown). Spray head 155 comprises one or more suitably oriented spray nozzles (not shown) for application of a surface mask layer and an edge masking layer to the various sections of printing plate 162.

In operation, tubular sleeve 166 is mounted on drum 158 by sliding tubular sleeve 166 axially over the cylindrical surface of drum 158. Preferably, the inner diameter of tubular sleeve 166 is sized for a snug fit on the cylindrical surface of drum 158. One or more section(s) of printing plate 162 are positioned on an upper surface 157 of table 156. Apparatus 150 preferably comprises a means for registering printing plate sections 162 on surface 157 of table 156. Such registration means are well known in the art. Preferably, but not necessarily, the edges of printing plate section(s) 162 are provided with bevelled profile as described above prior to being mounted on table 156.

Printing plate section(s) 162 are then loaded from table 156 onto tubular sleeve 166. To load plate section(s) 162 onto sleeve 166, drum 158 and pressure roller 160 are translated to positions adjacent to the leading edge 159 of table 156. Table 156 is then retracted from under plate section(s) 162 as drum 158 and pressure roller 160 are rotated in opposing angular directions about their respective elongated axes. As table 156 is retracted, the leading edge(s) of plate section(s) 162 are sandwiched between drum 158 and pressure roller 160, such that the rotation of drum 158 and pressure roller 160 draws plate section(s) 162 from table 156 and causes plate section(s) 162 to wrap themselves around the cylindrical surface of sleeve 166. The cylindrical surface of sleeve 166 may be provided with means for retaining plate sections 162 to the surface of sleeve 166. Such plate retention means may include any of the plate retention techniques known in the art including, for example, clamping, electrostatic force, vacuum force, adhesive or the like. In some embodiments, pressure roller 160 may also function to remove a cover sheet from the upper surface of plate section(s) 162.

After loading plate section(s) 162 onto sleeve 166, drum 158 is translated back down into the vicinity of spray head 155. In the illustrated embodiment, plate section(s) 162 are loaded onto sleeve 166 prior to the application of a surface mask layer or an edge masking layer. Once plate section(s) 162 are loaded onto sleeve 166, a surface mask layer (not shown) may be applied to the outer surface of plate section(s) 162 and/or an edge masking layer may be applied to the edges of plate section(s) 162 by the nozzle(s) of spray head 155. In order to apply the surface mask layer and/or the edge masking layer, spray head 155 moves axially along tracks 152 while drum 158 rotates about its axis. Surface mask layer 140 may be applied to photopolymer layer 118B in the manner described in above and in commonly assigned patent U.S. Pat. No. 6,180,325 (Gelbart). Spray head 155 and its spray nozzle(s) may comprise any of the embodiments described above and may function as described above for application of edge masking material(s) to the edges of plate section(s) 162. A controller 167 may be provided with the same types of information and function in the same manner described above to control the relative movement of drum 158 and spray head 155 and the activation and/or spray rate of the spray nozzles.

After mounting plate section(s) 162 onto sleeve 166 and applying the surface mask layer and the edge masking layer to plate section(s) 162, sleeve 166 bearing plate section(s) 162 is removed from combination mask application/plate mounting apparatus 150. Plate section(s) 162 are then patterned and further processed in one or more different apparatus to provide a relief image. After patterning and processing, sleeve 166 may be mounted on the cylindrical drum of a printing press so that the image(s) imparted onto plate section(s) 162 may be transferred to desired printing surface(s).

FIG. 6 depicts a selective mask application apparatus 85 according to one embodiment of the invention. In the illustrated embodiment, printing plate 87 is mounted on sleeve 81 in a plate-on-sleeve process. Sleeve 81 is supported on the cylindrical surface of drum 83. As is common in a plate-on-sleeve process, additional sections of printing plate (not shown) may also be mounted on sleeve 81. Drum 83 may also accommodate continuous CPPS plates (not shown). Instead of applying a uniform surface mask layer to plate 87 and then subsequently patterning the surface mask, selective coating head 80 of apparatus 85 forms a mask in a single step by imagewise applying a patterned masking material 84 to plate 87 only in desired locations.

Selective coating head 80 may comprise, for example, an inkjet printing head having one or more inkjet nozzle(s) 82. Ink jet nozzle(s) 82 of selective coating head 80 are capable of precisely ejecting droplets of masking material 84 at desired locations on the surface and on the edges 88 of plate 87. Preferably, as shown in the illustrated embodiment and described above, edges 88 of plate 87 are provided with a bevelled profile to facilitate the application of masking material 84 to edges 88.

Selective coating head 80 and inkjet nozzle(s) 82 are connected for communication with a controller 86, which may comprise one or more embedded processor(s), external processor(s), computer(s) or the like. Controller 86 controls the relative movement of selective coating head 80 and drum 83 and also controls the selective application of masking material 84 by inkjet nozzle(s) 82. Controller 86 may be provided with information regarding the location, size and shape of plate 87, the image(s) to be applied to plate 87, the format of plate 87 and the like. Controller 86 is provided with information regarding the location of edges 88 of plate 87, which it uses to apply masking material 84 to edges 88. As discussed above in relation to controller 56 of mask application apparatus 35, such edge location information may be deduced by software programmed into controller 86 or by an edge detection system. Controller 86 functions to control the relative movement of drum 83 and selective coating head 80 and the activation/deactivation and/or masking material ejection rate of inkjet nozzle(s) 82.

Controller 86 is also provided with information about the image(s) to be applied to plate 87, which it uses to control the imagewise application of masking material 84. Selective coating head 80 and its inkjet nozzle(s) 82 receive control signals from controller 86 which specify the locations at which masking material 84 is to be applied to plate 87. Inkjet nozzle(s) 82 are thus activated in regions where masking material 84 is to be applied and deactivated in regions where no masking material 84 is required.

When used in a plate-on-sleeve process where multiple printing plate sections are mounted on drum 83, controller 86 may also be provided with information similar to that described above in respect of each of the plate sections.

After the imagewise application of masking material 84 to the surface and edges 88 of plate 87, actinic flood radiation is applied to plate 87 to expose the unmasked photopolymer regions. Plate 87 is then processed to remove the masking material and either the exposed or unexposed photopolymer regions. These plate preparation procedures may be performed by components (not shown) that form part of mask application apparatus 85 or in by one or more different apparatus. After processing, plate 87 is transferred to a printing press where it may be used to transfer ink to desired printing surface(s).

Components of selective coating apparatus 85 may be provided within a combined mask application/plate patterning apparatus similar to that of FIG. 3. In particular, coating unit 126 may be replaced with selective coating head 80. When selective coating head 80 is used for the imagewise application of masking material to desired areas of the printing plate, there is no need for subsequent patterning of the masking layer and no separate patterning unit 132 is required.

Components of selective coating apparatus 85 may also be provided in a combined mask application/plate mounting apparatus similar to that of FIG. 4. In particular, mask application head 155 may be replaced with selective coating head 80. When selective coating head 80 is used for the imagewise application of masking material to desired areas of the printing plate on the plate mounting apparatus, there is no need for subsequent patterning of the masking layer and no separate patterning apparatus is required.

As will be apparent to those skilled in the art in the light of the foregoing disclosure, many alterations and modifications are possible in the practice of this invention without departing from the spirit or scope thereof. For example:
In accordance with any of the above-described embodiments:
   the surface mask layer and the edge masking layer may be applied by different spray heads or by different nozzles on the same spray head;
   the edge masking layer may comprise the same material used for the surface mask layer or, alternatively, the edge masking layer may comprise a different material such as the material described in U.S. Pat. No. 6,326,124 (Alince et al.); and,
   the edge masking layer and/or the surface mask layer may be formed from a number of constituent materials, each of which may have a separate spray nozzle.

In alternative embodiments of the invention, it is not necessary to provide an edge masking layer that coats the entire edge of a printing plate. For example, it may be sufficient to coat only the edge(s) of the photosensitive layer (e.g. the photopolymer layer), rather than the entire edge of the printing plate. In other embodiments, it may be sufficient to coat only a top portion of the edge of the photopolymer layer with edge masking material, leaving a bottom portion of the photopolymer layer edge to be exposed by UV flood radiation. Because of the lack of an edge masking layer on the bottom portion of the photopolymer layer edge, small ridges may be formed in edge regions of the photopolymer layer. However, these small ridges would be located only in the bottom portion of the photopolymer layer adjacent the unmasked bottom edge portions. As a result, the processed plate is still able to provide sufficient relief to avoid transferring ink from these ridges to the desired printing surface.

In further alternative embodiments of the invention, a "page-wide" spray head may be provided with spray nozzles to apply edge masking material to the edges of printing plates. A page-wide spray head has an array of nozzles that spans the axial dimension of the drum. In such embodiments, it may not be necessary to move the spray head, as rotation of the drum is sufficient to provide complete coverage of the printing plate(s) mounted thereon.

A number of the embodiments described above involve the edge treatment apparatus and methods of the present invention integrated with other flexographic plate preparation apparatus, such as: a mask application device (FIG. 2-A); a combined mask application/plate patterning device (FIG. 3); and a combined mask application/plate mounting device (FIG. 4)). While it may be advantageous to integrate the edge treatment apparatus and methods of the present invention with these other plate preparation devices, edge treatment may also be performed within a separate apparatus or as part of a separate plate preparation process.

Surface and edge masking layers other than a LAMS layer may be used in accordance with the principles of the invention. The surface and edge masking layers may comprise other types of mask materials having optical characteristics which may be selectively altered by exposure to, for example, laser radiation. For example, surface and edge masking layers may comprise thermally sensitive coatings, such as Thermal Dry Silver™ sold by 3M of Minneapolis, Minn. This thermally sensitive coating is initially UV-transparent, but becomes UV-opaque when exposed to heat.

Accordingly, the scope of the invention is to be construed in accordance with the substance defined by the following claims.

What is claimed is:

1. A method for preparing a flexographic printing plate, the method comprising:
   mounting a printing plate comprising a photosensitive imageable layer on a cylindrical drum;
   obtaining, in a controller, electronic data corresponding to a location of at least one edge of the printing plate; and
   while the printing plate is on the drum:
      applying a surface mask layer to the printing plate, the surface mask layer masking a surface of the photosensitive imageable layer;
      applying an edge masking layer to the at least one edge, the edge masking layer masking at least a portion of the photosensitive imageable layer on the at least one edge; and,
      patterning the surface mask layer;
   wherein applying the edge masking layer comprises automatically applying the edge masking layer in the location of the at least one edge under control of the controller.

2. The method of claim 1 wherein both the surface mask layer and the edge masking layer are formed from a material having the same composition.

3. The method of claim 2 wherein applying the edge masking layer to the at least one edge of the printing plate is at least partially completed after commencing, but prior to completion of, applying the surface mask layer to the printing plate.

4. The method of claim 2 wherein the material having the same composition comprises a negative working material.

5. The method of claim 4 wherein the negative working material contains carbon.

6. The method of claim 2 wherein the material having the same composition comprises a positive working material and wherein the method comprises rendering the edge masking layer opaque to actinic radiation by exposing the edge masking layer to radiation.

7. The method of claim 1 comprising irradiating the edge masking layer to form an edge mask area.

8. The method of claim 1 wherein patterning the surface mask layer comprises imagewise irradiating the surface mask layer.

9. The method of claim 1 wherein the printing plate comprises a continuous photopolymer sleeve.

10. The method of claim 1 wherein the printing plate comprises one or more plate sections applied to a tubular sleeve, each plate section comprising a photosensitive imageable layer.

11. The method of claim 1 comprising exposing at least a portion of the photosensitive imageable layer to actinic radiation.

12. The method of claim 11 wherein exposing at least a portion of the photosensitive imageable layer to actinic radiation is performed while the printing plate is on the drum.

13. The method of claim 11 wherein exposing at least a portion of the photosensitive imageable layer to actinic radiation is performed after removing the printing plate from the drum.

14. The method of claim 11 comprising, after exposing at least a portion of the photosensitive imageable layer to actinic radiation, removing portions of the photosensitive imageable layer to form a relief image.

15. The method of claim 1 wherein the surface mask layer comprises a positive working material and the edge masking layer comprises a negative working material.

16. The method of claim 1 wherein obtaining, in the controller, electronic data corresponding to the location of the at least one edge comprises determining the location of the at least one edge based on at least one of: format data provided to an automated printing plate cutting device; and format data provided to a printing plate mounting device.

17. The method of claim 1 wherein obtaining, in the controller, electronic data corresponding to the location of the at least one edge comprises determining the location of the at least one edge using an edge detection sensor.

18. The method of claim 17 wherein the edge detection sensor comprises at least one of: an optical sensor; an imaging sensor; a capacitive probe; and a physical contact-based edge detector.

19. A method for preparing a flexographic printing plate, the method comprising:
mounting a printing plate comprising a photosensitive imageable layer on a cylindrical drum; and,
while the printing plate is on the drum:
applying a surface mask layer to the printing plate, the surface mask layer masking a surface of the photosensitive imageable layer;
applying an edge masking layer to at least one edge of the printing plate, the edge masking layer masking at least a portion of at least one edge of the photosensitive imageable layer; and,
patterning the surface mask layer;
wherein applying an edge masking layer is performed in response to at least one of: image data; format data; data relating to one or more dimensions of the printing plate; data relating to one or more edge locations of the printing plate; data relating to one or more dimensions of the photosensitive imageable layer; and data relating to one or more edge locations of the photosensitive imageable layer and wherein the at least one edge of the photosensitive imageable layer comprises a bevelled profile, the bevelled profile having a bevel angle of less than 90°.

20. The method of claim 19 comprising cutting the bevelled profile on an automated cutting table in accordance with format data supplied to a controller associated with the automated cutting table.

21. A method for preparing a flexographic printing plate, the method comprising:
mounting one or more plate sections to a tubular sleeve, each plate section comprising a photopolymer layer;
mounting the tubular sleeve with mounted plate sections on a cylindrical drum;
obtaining, in a controller, electronic data corresponding to locations of one or more edges of the one or more plate sections; and
while the sleeve is on the drum and under control of the controller, automatically applying an edge masking layer to the one or more edges of the one or more plate sections in the obtained locations, the edge masking layer masking at least a portion of each of the one or more edges of the one or more plate sections.

22. The method of claim 21 wherein each of the one or more plate sections comprises an integral surface mask layer atop its corresponding photopolymer layer.

23. The method of claim 21 comprising, while the sleeve is on the drum, applying a surface mask layer to printing areas of the one or more plate sections.

24. The method of claim 21 comprising applying a surface mask layer to printing areas of the one or more plate sections.

25. The method of claim 21 wherein obtaining, in the controller, electronic data corresponding to locations of one or more edges of the one or more plate sections, comprises determining the locations of the one or more edges based on at least one of: format data provided to an automated printing plate cutting device; and format data provided to a printing plate mounting device.

26. The method of claim 21 comprising determining locations of the one or more edges of the one or more plate sections using an edge detection sensor.

27. The method of claim 26 wherein the edge detection sensor comprises at least one of: an optical sensor; an imaging sensor; a capacitive probe; and a physical contact-based edge detector.

28. The method of claim 21 comprising, while the sleeve is on the drum, applying a surface mask layer to the one or more plate sections, the surface mask layer masking a surface of the photopolymer layer for each of the one or more plate sections, wherein automatically applying the edge masking layer to the one or more edges of the one or more plate sections is at least partially completed after commencing, but prior to completion of, applying the surface mask layer to the one or more plate sections.

29. The method of claim 21 comprising, while the sleeve is on the drum, imagewise applying a surface mask layer to the one or more plate sections, the surface mask layer imagewise masking a surface of the photopolymer layer for each of the one or more plate sections, wherein automatically applying the edge masking layer to the one or more edges of the one or more plate sections is at least partially completed after commencing, but prior to completion of, imagewise applying the surface mask layer to the one or more plate sections.

30. A method for preparing a flexographic printing plate, the method comprising:
mounting one or more plate sections to a tubular sleeve, each plate section comprising a photopolymer layer;
mounting the tubular sleeve with mounted plate sections on a cylindrical drum; and,
while the sleeve is on the drum and in response to data provided by a controller, applying an edge masking layer to the one or more plate sections, the edge masking layer masking one or more edges of the photopolymer layers associated with the one or more plate sections;
wherein the one or more edges of the photopolymer layers comprise a bevelled profile, the bevelled profile having a bevel angle of less than 90°.

31. The method of claim 30 comprising cutting the bevelled profile on an automated cutting table in accordance with format data supplied to a controller associated with the automated cutting table.

32. A method for preparing a flexographic printing plate, the method comprising:
mounting a printing plate comprising a photopolymer layer on a cylindrical drum;
obtaining, in a controller, electronic data corresponding to a location of at least one edge of the printing plate; and
while the printing plate is on the drum:
imagewise applying a patterned surface mask layer to a printing area of the printing plate; and,
automatically applying an edge masking layer to the printing plate in the location of the at least one edge under control of the controller, the edge masking layer masking at least a portion of the photopolymer layer on the at least one edge.

33. The method of claim 32 wherein the printing plate comprises a continuous photopolymer sleeve.

34. The method of claim 32 wherein the printing plate comprises one or more plate sections applied to a tubular sleeve, each plate section comprising a photopolymer layer.

35. The method of claim 32 comprising exposing at least a portion of the photopolymer layer to actinic radiation.

36. The method of claim 35 wherein exposing at least a portion of the photopolymer layer to actinic radiation is performed while the printing plate is on the drum.

37. The method of claim 35 wherein exposing at least a portion of the photopolymer layer to actinic radiation is performed after removing the printing plate from the drum.

38. The method of claim 35 comprising, after exposing at least a portion of the photopolymer layer to actinic radiation, removing portions of the photopolymer layer to form a relief image.

39. The method of claim 32 wherein the surface mask layer and the edge masking layer are formed from a material having the same composition and wherein automatically applying the edge masking layer to the printing plate is at least partially completed after commencing, but prior to completion of, imagewise applying the patterned surface mask layer to the printing area of the printing plate.

40. The method of claim 32 wherein obtaining, in the controller, electronic data corresponding to the location of the at least one edge comprises determining the location of the at least one edge based on at least one of: format data provided to an automated printing plate cutting device; and format data provided to a printing plate mounting device.

41. The method of claim 32 wherein obtaining, in the controller, electronic data corresponding to the location of the at least one edge comprises determining the location of the at least one edge using an edge detection sensor.

42. The method of claim 41 wherein the edge detection sensor comprises at least one of: an optical sensor; an imaging sensor; a capacitive probe; and a physical contact-base edge detector.

43. The method of claim 32 wherein automatically applying the edge masking layer to the printing plate in the location of the at least one edge comprises ejecting liquid from one or more inkjet nozzles.

44. A method for preparing a flexographic printing plate, the method comprising:
mounting a printing plate comprising a photopolymer layer on a cylindrical drum; and,
while the printing plate is on the drum and in response to data provided by a controller:
imagewise applying a patterned surface mask layer to a printing area of the printing plate; and,
applying an edge masking layer to the printing plate, the edge masking layer masking one or more edges of the photopolymer layer;
wherein the one or more edges of the photopolymer layer comprise a bevelled profile, the bevelled profile having a bevel angle of less than 90°.

45. The method of claim 44 comprising cutting the bevelled profile on an automated cutting table in accordance with format data supplied to a controller associated with the automated cutting table.

46. A method for preparing a flexographic printing plate, the method comprising:
mounting a printing plate on a cylindrical drum, the printing plate comprising an integral surface mask layer and a photopolymer layer;
obtaining, in a controller, electronic data corresponding to a location of at least one edge of the printing plate; and
while the printing plate is on the drum:
automatically applying an edge masking layer to the printing plate in the location of the at least one edge under control of the controller, the edge masking layer masking at least a portion of the photopolymer layer on the at least one edge; and,
patterning the integral surface mask layer.

47. The method of claim 46 wherein patterning the integral surface mask layer comprises exposing the integral surface mask layer to an imagewise distribution of radiation.

48. The method of claim 46 wherein the printing plate comprises a continuous photopolymer sleeve.

49. The method of claim 46 wherein the printing plate comprises one or more plate sections applied to a tubular sleeve.

50. The method of claim 46 comprising exposing at least a portion of the photopolymer layer to actinic radiation.

51. The method of claim 50 wherein exposing at least a portion of the photopolymer layer to actinic radiation is performed while the printing plate is on the drum.

52. The method of claim 50 wherein exposing at least a portion of the photopolymer layer to actinic radiation is performed after removing the printing plate from the drum.

53. The method of claim 50 comprising, after exposing at least a portion of the photopolymer layer to actinic radiation, removing portions of the photopolymer layer to form a relief image.

54. The method of claim 46 wherein the edge masking layer comprises a negative working material.

55. The method of claim 54 wherein the negative working material contains carbon.

56. The method of claim 46 wherein the edge masking layer comprises a positive working material and wherein the method comprises rendering the edge masking layer opaque to actinic radiation by exposing the edge masking layer to radiation.

57. The method of claim 46 wherein the integral surface mask layer comprises a positive working material and the edge masking layer comprises a negative working material.

58. The method of claim 46 wherein obtaining, in the controller, electronic data corresponding to the location of the at least one edge comprises determining the location of the at least one edge based on at least one of: format data provided to an automated printing plate cutting device; and format data provided to a printing plate mounting device.

59. The method of claim 46 wherein obtaining, in the controller, electronic data corresponding to the location of the at least one edge comprises determining the location of the at least one edge using an edge detection sensor.

60. The method of claim 59 wherein the edge detection sensor comprises at least one of: an optical sensor; an imaging sensor; a capacitive probe; and a physical contact-based edge detector.

61. A method for preparing a flexographic printing plate, the method comprising:
mounting a printing plate on a cylindrical drum, the printing plate comprising an integral surface mask layer and a photopolymer layer; and,
while the printing plate is on the drum and in response to data provided by a controller:
applying an edge masking layer to the printing plate, the edge masking layer masking at least one edge of the photopolymer layer; and,
patterning the integral surface mask layer;
wherein the at least one edge of the photopolymer layer comprises a bevelled profile, the bevelled profile having a bevel angle of less than 90°.

62. The method of claim 61 comprising cutting the bevelled profile on an automated cutting table in accordance with format data supplied to a controller associated with the automated cutting table.

* * * * *